United States Patent
Saigou et al.

(10) Patent No.: US 11,164,766 B2
(45) Date of Patent: Nov. 2, 2021

(54) OPERATING METHOD OF VACUUM PROCESSING APPARATUS

(71) Applicant: HITACHI HIGH-TECH CORPORATION, Tokyo (JP)

(72) Inventors: Yoshikazu Saigou, Tokyo (JP); Yoshiro Suemitsu, Tokyo (JP); Hiroyuki Ishikawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 61 days.

(21) Appl. No.: 16/641,329

(22) PCT Filed: Feb. 7, 2019

(86) PCT No.: PCT/JP2019/004511
§ 371 (c)(1),
(2) Date: Feb. 24, 2020

(87) PCT Pub. No.: WO2020/167873
PCT Pub. Date: Aug. 13, 2020

(65) Prior Publication Data
US 2021/0151336 A1    May 20, 2021

(51) Int. Cl.
*H01L 21/67*    (2006.01)
*H01L 21/677*    (2006.01)
*H01L 21/683*    (2006.01)

(52) U.S. Cl.
CPC .. *H01L 21/67161* (2013.01); *H01L 21/67196* (2013.01); *H01L 21/67736* (2013.01); *H01L 21/6838* (2013.01)

(58) Field of Classification Search
CPC ......... H01L 21/67736; H01L 21/67196; H01L 21/67276; H01L 21/67184; H01L 21/67161; H01L 21/6838
See application file for complete search history.

(56) References Cited

U.S. PATENT DOCUMENTS 7,945,348 B2 * 5/2011 Pannese ............ H01L 21/67196
700/248
2008/0232934 A1 * 9/2008 Price ................. H01L 21/67196
414/217

(Continued)

FOREIGN PATENT DOCUMENTS

JP    2013098412 A    5/2013

*Primary Examiner* — Dung A. Le
(74) *Attorney, Agent, or Firm* — Miles & Stockbridge, P.C.

(57) ABSTRACT

Provided is a technique capable of implementing efficient transport and processing related to multi-step processing in the case of a link-type vacuum processing apparatus with related to an operating method of a vacuum processing apparatus. The operating method of the vacuum processing apparatus according to the embodiment, in order to minimize time required for all processing of a plurality of wafers in a multi-step processing, includes a first step (steps 601 to 607) of selecting one first processing unit and one second processing unit from a plurality of processing units for each wafer and determining a transport schedule including a transport path using the selected processing units. In the first step, for at least one wafer, a transport schedule including a transport path is configured using the selected first processing unit by excluding at least one first processing unit from the plurality of first processing units. The operating method selects an optimal transport schedule when a second step is rate-limited.

7 Claims, 6 Drawing Sheets

(56) References Cited

U.S. PATENT DOCUMENTS

| | | | |
|---|---|---|---|
| 2012/0303258 A1* | 11/2012 | Pampus | B60W 30/0956 |
| | | | 701/301 |
| 2013/0108400 A1 | 5/2013 | Nogi et al. | |
| 2013/0178954 A1* | 7/2013 | Mizuguchi | G05B 15/02 |
| | | | 700/78 |

* cited by examiner

[FIG. 1]
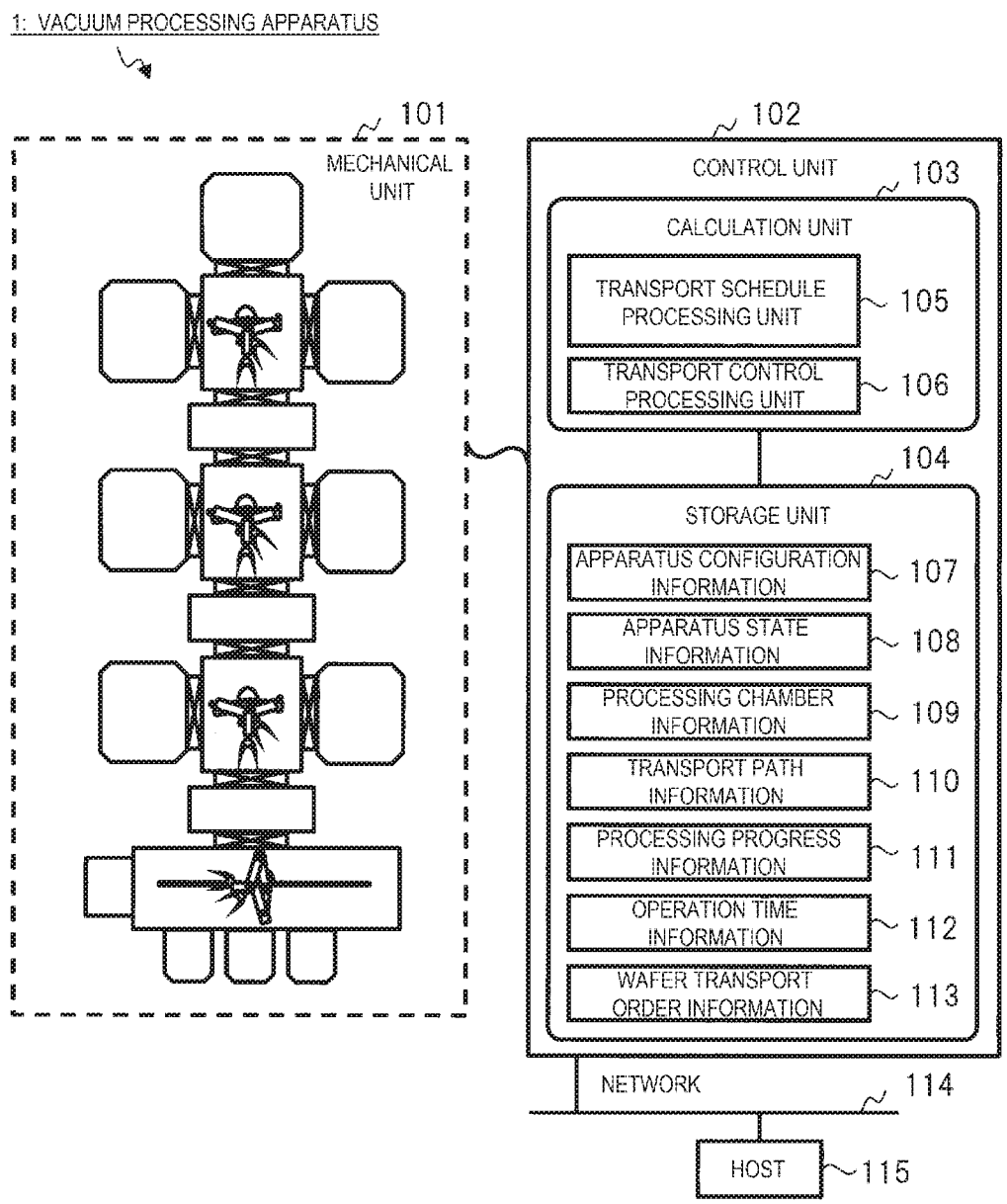

[FIG. 2]
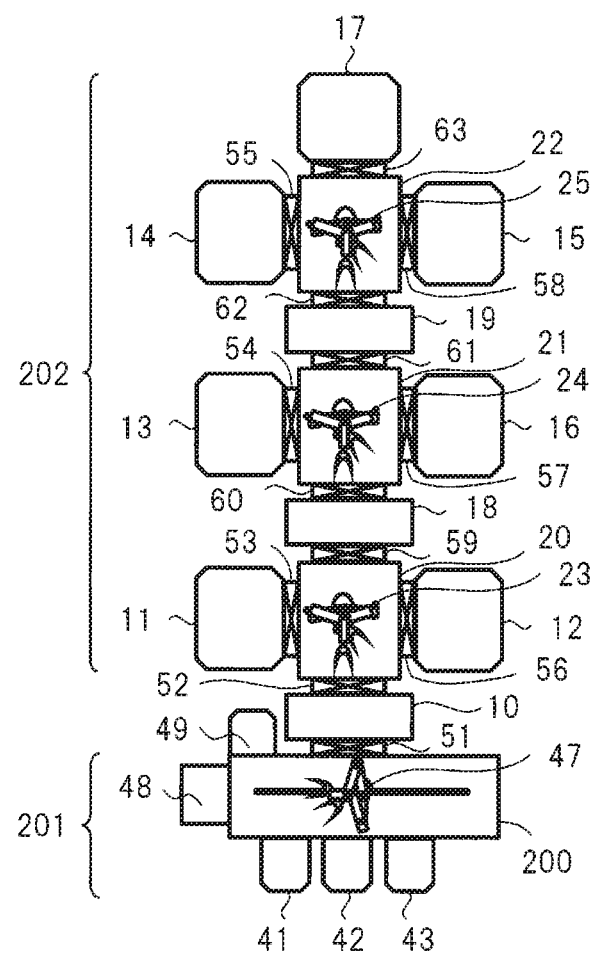

[FIG. 3]

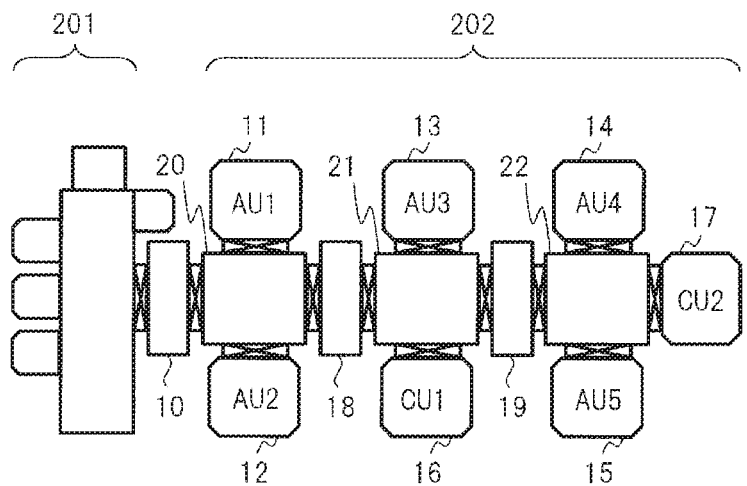

| PREVIOUS STEP (FIRST STEP) FIRST PROCESSING UNIT AND FIRST PROCESSING CHAMBER  AU: ASHING UNIT {AU1~AU5} |
| SUBSEQUENT STEP (SECOND STEP) SECOND PROCESSING UNIT AND SECOND PROCESSING CHAMBER  CU: COOLING UNIT {CU1, CU2} |

| FIRST PROCESSING UNIT AND FIRST PROCESSING CHAMBER  NUMBER: M  EXAMPLE: M = 5 |
| USE NUMBER: K (K ≤ M)  EXCLUSION NUMBER: L (= 1, 2, ...) |
| SECOND PROCESSING UNIT AND SECOND PROCESSING CHAMBER  NUMBER: N (M > N ≥ 2)  EXAMPLE: N = 2 |

| PATH CANDIDATE | START | PREVIOUS STEP | SUBSEQUENT STEP | END |
|---|---|---|---|---|
| 1 | FOUP | AU1 | CU1 or CU2 | FOUP |
| 2 | FOUP | AU2 | CU1 or CU2 | FOUP |
| 3 | FOUP | AU3 | CU1 or CU2 | FOUP |
| 4 | FOUP | AU4 | CU1 or CU2 | FOUP |
| 5 | FOUP | AU5 | CU1 or CU2 | FOUP |

[FIG. 5]
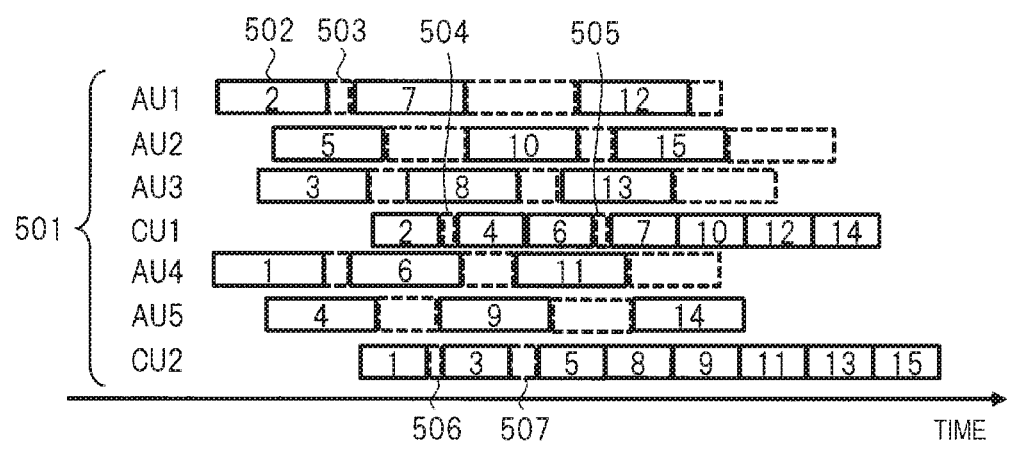

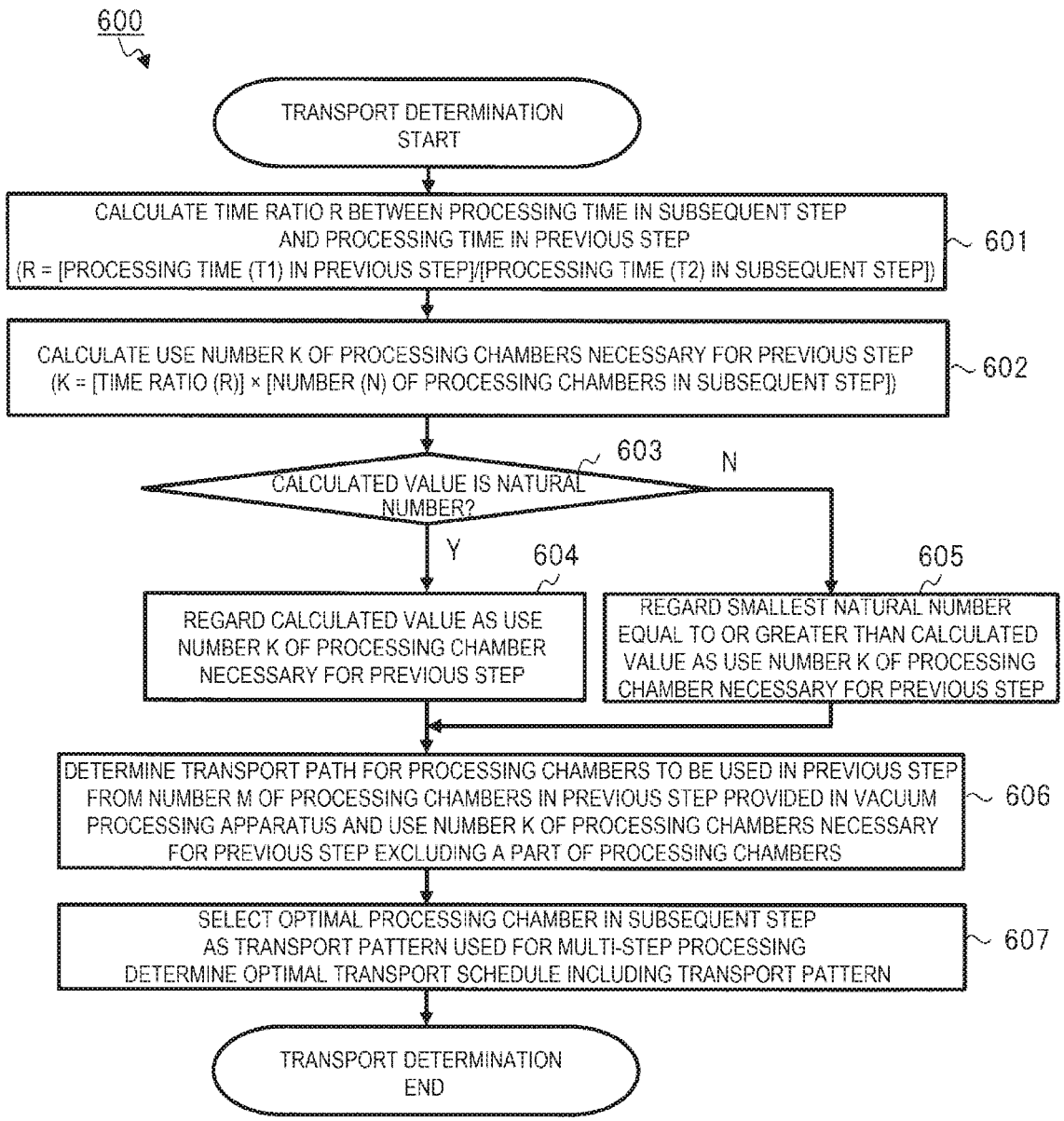
[FIG. 6]

[FIG. 7]
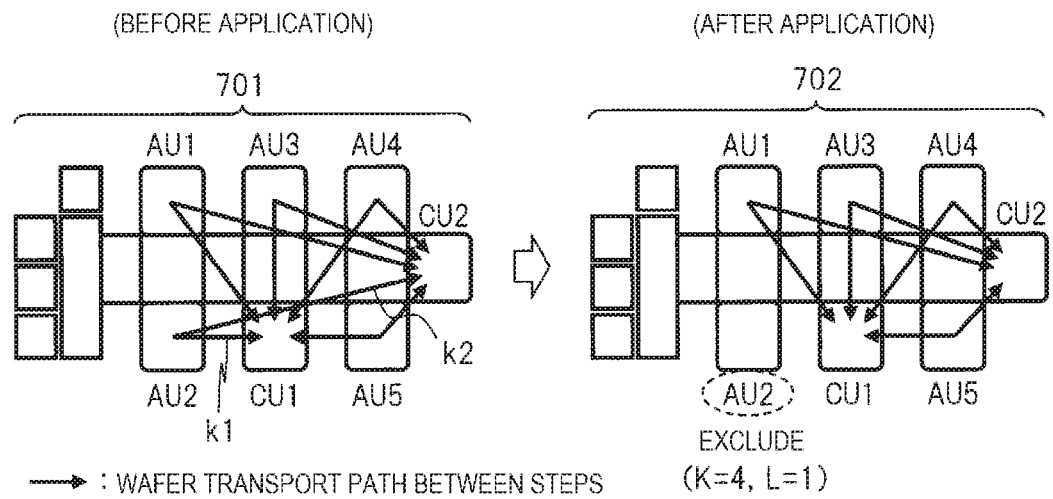
[FIG. 8]
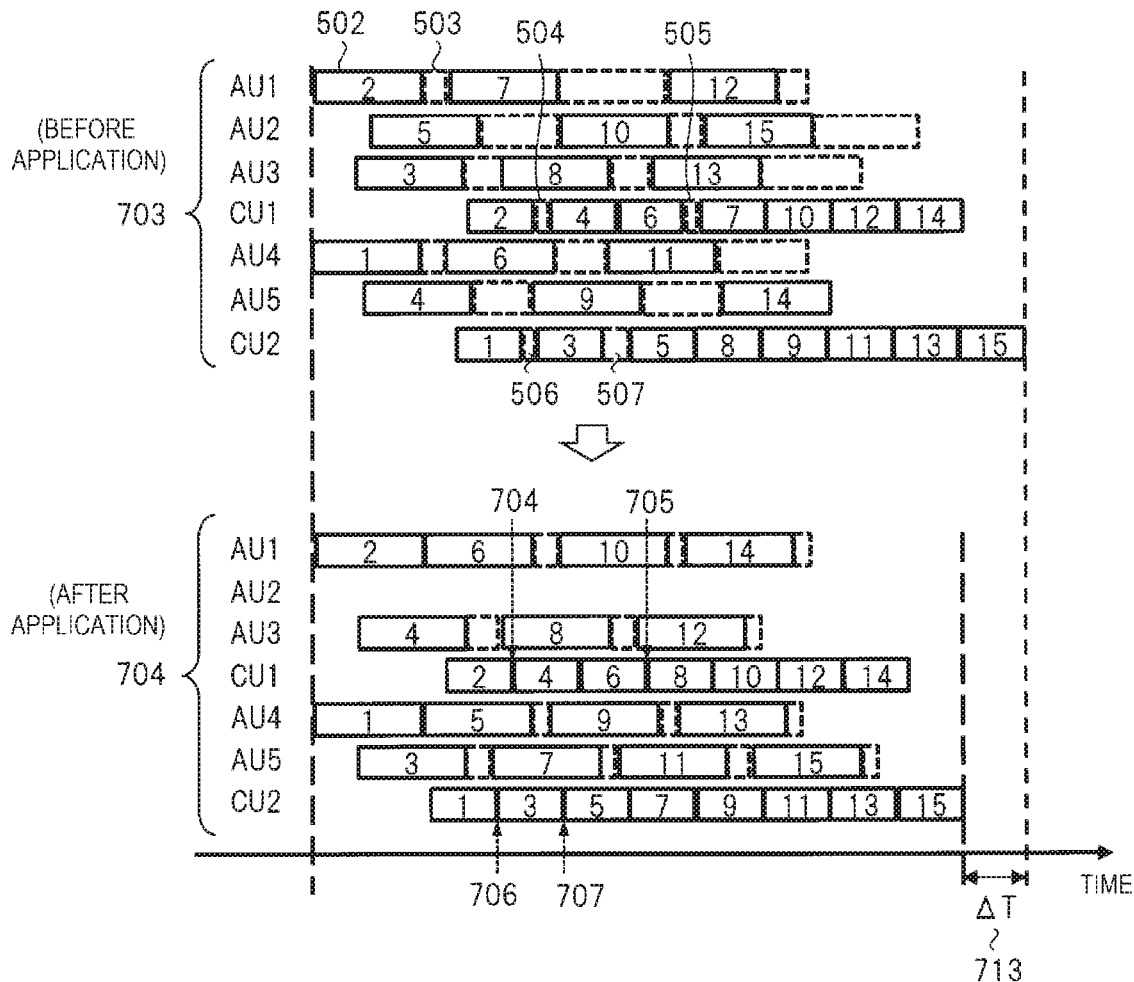

OPERATING METHOD OF VACUUM PROCESSING APPARATUS

TECHNICAL FIELD

The present invention relates to a vacuum processing apparatus and the like, and relates to an operating method in multi-step processing of a vacuum processing apparatus.

BACKGROUND ART

A vacuum processing apparatus is a link-type vacuum processing apparatus in which a plurality of vacuum transport containers each having a transport robot are connected, and a plurality of processing units are connected to the plurality of vacuum transport containers.

PTL 1 is exemplified as a prior art example related to the operating method of the vacuum processing apparatus as described above. PTL 1 discloses a technique for improving a throughput (number of processed sheets per unit time) when a plurality of wafers are continuously processed in a linear tool vacuum processing apparatus that transports wafers between a plurality of transport robots. PTL 1 discloses that, based on transport algorithm determination rules obtained by simulating a plurality of transport algorithms that control transport of wafers for each combination of the number and arrangement of processing chambers and processing time of the wafer before starting transport of the plurality of wafers, by selecting a transport algorithm that is expected to have a largest throughput value and calculating a wafer transport destination based on the selected transport algorithm, transport control with the highest throughput is provided.

CITATION LIST

Patent Literature

PTL 1: JP-A-2013-98412

SUMMARY OF INVENTION

Technical Problem

The technique disclosed in PTL 1 improves apparatus utilization efficiency by selecting the transport algorithm having the highest throughput based on simulation for multi-step processing. The multi-step processing refers to completion of entire processing by performing each processing of each step on an object to be processed such as the same wafer in a plurality of different processing chambers. Single-step processing refers to completion of entire processing by performing single processing of a single step on the same object to be processed in any one of the processing chambers.

In the related art as described above, a load of simulation calculation may increase when selecting a transport algorithm (in other words, a transport schedule) related to multi-step processing. In this case, for example, it is necessary to simplify calculation processing in accordance with capability of a control system of a vacuum processing apparatus. For this reason, there may be a case where an optimal transport schedule including an optimal transport pattern cannot be selected. The related art does not fully takes into consideration of an increase of the number of transport patterns to be simulated due to a combination of processing chambers used for transporting and processing wafers as compared with single-step processing.

Generally, for example, in the production of a large number of semiconductor devices, a vacuum processing apparatus used in amass production process is operated by continuously executing processing under the same condition determined in each step of multi-step processing.

An object of the invention is to provide a technique capable of implementing efficient transport and processing related to multi-step processing in the case of a link-type vacuum processing apparatus relating to an operating method of a vacuum processing apparatus. Another object of the invention is to provide a technique capable of selecting an optimal transport pattern while preventing an overall processing load even when a second step which is a subsequent step among a plurality of steps is rate-limited (in other words, in a case of a bottleneck) in processing conditions where processing time of a plurality of processing units that are candidates for use for each step (a plurality of corresponding processing chambers) is the same.

Solution to Problem

A representative embodiment of the invention is an operating method of a vacuum processing apparatus, and has the following configuration. The vacuum processing apparatus includes: a plurality of vacuum transport containers arranged side by side, each of which stores a transport robot that transports a wafer to each of the vacuum transport containers; a plurality of intermediate chambers disposed between two adjacent vacuum transport containers in the plurality of vacuum transport containers, and storing the wafer; a load lock chamber connected to one of the plurality of vacuum transport containers, storing the wafer, and capable of reducing pressure to a predetermined pressure and increasing pressure to atmospheric pressure; and a plurality of processing units connected to the plurality of vacuum transport containers including, among multi-step processing, a plurality of first processing units for performing first processing of a first step and a plurality of second processing units for performing second processing of a second step, with each processing unit including a processing chamber that is configured to process the wafer. The operating method includes: a first step of selecting one first processing unit and one second processing unit among the plurality of processing units for each wafer, and determining a transport schedule including a transport path using the selected processing units, which is a step of determining a transport schedule such that time required for all processing of the plurality of wafers in the multi-step processing is the shortest; and a second step of transporting each wafer of the plurality of wafers stored in a cassette that is arranged in front of the load lock chamber according to the transport schedule, implementing the first processing using the one first processing unit of the first step, and then controlling to implement the second processing using the one second processing unit of the second step. The first step configures the transport schedule including the transport path using the first processing unit selected from the plurality of first processing units by excluding at least one first processing unit for at least one of the plurality of wafers.

Advantageous Effect

According to the representative embodiment of the invention, it is possible to implement efficient transport and processing related to multi-step processing in the case of the link-type vacuum processing apparatus relating to the operating method of the vacuum processing apparatus. Further, according to the representative embodiment of the invention, it is possible to select the optimal transport pattern while preventing the overall processing load even when the second step which is the subsequent step among the plurality of steps is rate-limited in the processing conditions where the processing time of the plurality of processing units that are candidates for use for each step (a plurality of corresponding processing chambers) is the same.

BRIEF DESCRIPTION OF DRAWINGS

FIG. 1 is a diagram showing an overall schematic configuration of a vacuum processing apparatus in an operating method of a vacuum processing apparatus according to an embodiment of the invention.

FIG. 2 is a diagram showing a configuration of a mechanical unit of the vacuum processing apparatus according to the embodiment.

FIG. 3 is a diagram showing an arrangement configuration example of a plurality of processing units under a multi-step processing condition according to the embodiment.

FIG. 4 is a diagram showing a configuration example of transport path information under the multi-step processing condition according to the embodiment.

FIG. 5 is a time chart of wafer processing of a plurality of processing units under the multi-step processing condition in an operating method of a comparative example with respect to the embodiment.

FIG. 6 is a diagram showing a processing flow of transport determination processing for determining a transport schedule for optimizing throughput under the multi-step processing condition according to the embodiment.

FIG. 7 is a diagram comparing and showing an example of a transport path before and after application of a transport determination method according to the embodiment.

FIG. 8 is a diagram comparing and showing a time chart of wafer processing before and after the application of the transport determination method according to the embodiment.

DESCRIPTION OF EMBODIMENTS

Hereinafter, an embodiment of the invention will be described in detail with reference to the accompanying drawings.

Problem

Supplemental description of a problem related to the related art will be given. As described above, an operating method in the related art determines a transport schedule related to multi-step processing in a link-type (or a linear tool) vacuum processing apparatus. In that case, since the operating method in the related art needs to perform calculation in consideration of a combination of a plurality of processing units (a plurality of corresponding processing chambers), a processing load may increase, and a transport schedule including an optimal transport pattern may not be selected.

The operating method in the related art lacks a processing capacity of a control system, for example, when there is a combination of a plurality of processing units. Therefore, the operating method in the related art performs transport control only for a first step on the premise of an apparatus configuration including a plurality of processing chambers in which a second step is not rate-limited with respect to general processing conditions of the vacuum processing apparatus. In this case, the operating method in the related art may not select the optimal transport pattern for a transport path including the first step which is a previous step and the second step which is a subsequent step. Specifically, the second step is rate-limited according to a relationship between processing time of processing of the first step and the second step and a combination of the selected processing chambers.

In the relationship between the processing time of the above steps, transport waiting time may occur as follows. When a wafer is transported from Front-Opening-Unified Pod (FOUP) earlier than a timing required for a processing chamber in the subsequent step relative to a processing chamber in the previous step, a wafer in the previous step resides. In other words, the FOUP is a cassette in which a plurality of wafers are accommodated. As a result, the wafer residing on the transport path is generated. Based on the influence, the wafer cannot be transported at a timing required for the processing chamber in each of the next steps. Accordingly, the wafer transport waiting time occurs in the processing chamber in each step.

In the relationship of the combination of the selected processing chambers, the transport waiting time may occur as follows. If an empty processing chamber in a next subsequent step is not properly selected when the wafer is transported from the processing chamber in the previous step, the wafer in the processing chamber in the subsequent step resides. Along with this, the wafer in the previous step also resides. Meanwhile, the wafer is not transported to another empty processing chamber in the subsequent step at a necessary timing. Accordingly, the wafer transport waiting time occurs in the processing chambers in each step.

Therefore, in an operating method according to the embodiment of the invention, in the condition that processing time of a plurality of processing chambers in each step of multi-step processing in a link-type vacuum processing apparatus is the same, even when the second step which is a subsequent step is rate-limited, an optimal transport schedule with short transport waiting time is determined.

First Embodiment

The operating method of the vacuum processing apparatus according to the embodiment of the invention will be described with reference to FIGS. 1 to 8. The operating method according to the embodiment is an operating method related to the multi-step processing of the link-type vacuum processing apparatus, in other words, a control method and a calculation method. The operating method is a method of determining a transport schedule including an efficient transport pattern for a plurality of processing chambers (corresponding processing units) related to multi-step processing of an object to be processed, in other words, a transport schedule that maximizes throughput.

(1) Outline

The vacuum processing apparatus applied in the operating method in the embodiment is the link-type (in other words, a linear tool) vacuum processing apparatus that performs processing using plasma or the like in a processing chamber in a vacuum container with respect to a wafer as an object to be processed. The object to be processed is, for example, a semiconductor wafer used for manufacturing a semiconductor device. The link-type vacuum processing apparatus is a vacuum processing apparatus of a system having a structure for implementing improvement in throughput by reducing an installation area of a mechanical unit. The link-type vacuum processing apparatus has a structure in which a plurality of vacuum transport containers each having a transport robot are arranged, for example, in a first direction, and processing units including processing chambers are connected to a side wall of each vacuum transport container. The plurality of vacuum transport containers are connected via, for example, an intermediate chamber (in other words, an intermediate container). The vacuum processing apparatus includes a plurality of transport robots, the plurality of transport robots are arranged in parallel and transport wafers.

In the operating method, in wafer processing, each of a first step which is a previous step and a second step which is a subsequent step is implemented separately in each of a first processing unit and a second processing unit as multi-step processing. The first processing unit includes a first processing chamber. The second processing unit includes a second processing chamber. The multi-step processing includes first processing of the first step which is the previous step, and second processing of a second step which is the subsequent step. The first processing of the first step is performed in a first processing chamber of the selected first processing unit, and the second processing of the second step is performed in a second processing chamber of the selected second processing unit.

The operating method determines a transport schedule based on simulation calculation in a control system to further increase throughput of the wafer processing. The transport schedule is a concept including transport patterns (in other words, a plurality of transport paths) and a transport timing in each transport path. The transport timing is, for example, a transport start timing of a wafer from each station. In the operating method, for a group of wafers, in other words, for a lot, a transport schedule including a processing unit to which the wafers are transported for processing and an order thereof is selected in advance before the transport of the wafers is started. The transport schedule includes selection of the first processing unit used in the first step and the second processing unit used in the second step for each wafer to be processed.

A mechanical unit of the vacuum processing apparatus includes a predetermined plurality (number M) of first processing units and a predetermined plurality (number N) of second processing units. These processing units are candidates for use in the transport schedule. In particular, in the embodiment, the number N of the second processing units for the second step is smaller than the number M of the first processing units for the first step (M>N) as a relationship between the number of the processing units and the number of processing chambers. As a condition, processing time (T1) of each of the plurality of first processing units and the first processing chambers in the first step is the same, and processing time (T2) of each of the second processing units and the second processing chambers in the second step is the same. The second step may be rate-limited in accordance with the condition of the number of processing chambers and the processing time.

The operating method in the embodiment, in this case, based on determination of the relationship between the number of processing units (M, N) and the processing time (T1, T2) in respective steps, calculates a number (K) of processing chambers required in the previous step (K≤M). That is, the operating method excludes a part of the first processing units among the plurality of first processing units for the first step from candidates for use in the first step. The operating method creates a plurality of schedule candidates including a plurality of transport path candidates by using a plurality of (use number K) first processing units which are candidates after exclusion. Then, based on calculation, the operating method selects one schedule having the highest throughput from the plurality of schedule candidates, and determines the schedule as a transport schedule. In the operating method, the determined transport schedule is used for implementing the wafer processing. The highest throughput corresponds to a shortest time required for all processing of a plurality of wafers in the multi-step processing.

The operating method according to the embodiment configures a transport schedule in a manner that the wafer is transported from the FOUP to the first processing chamber in the previous step such that the first processing in the previous step is completed in accordance with timing when the second processing chamber in the subsequent step needs the wafer, and a next empty second processing chamber in the subsequent step is correctly selected as a wafer transport destination from the first processing chamber in the previous step.

Specifically, the operating method selects the first processing chamber used in the previous step such that a difference in the number of processed wafers in the second processing chambers in the subsequent processing is minimized. That is, the operating method calculates the use number K of the first processing chambers in the previous step required when the processed wafers becomes equal in number. The operating method excludes a part of the first processing chambers among the previous steps in accordance with the use number K, and configures K first processing chambers to be used and a transport path for the first processing chambers. The operating method selects a second processing chamber to be used in a subsequent step in accordance with a processing condition of each second processing chamber in the subsequent step from the first processing chamber in the previous step, and configures a transport path to the second processing chamber from the first processing chamber. The transport schedule for each wafer constituted in this way prevents occurrence of wafer transport waiting time in the processing chamber in each step, or minimizes the transport waiting time.

(2) Vacuum Processing Apparatus

An overall schematic configuration of a vacuum processing apparatus 1 according to the embodiment will be described with reference to FIG. 1. The vacuum processing apparatus 1 is roughly divided into a mechanical unit 101 and a control unit 102 that controls operation of the mechanical unit 101. The control unit 102 and the mechanical unit 101 are connected by a cable or the like. The mechanical unit 101 is an apparatus mechanical unit including a transport mechanism including a transport robot, a processing unit including a processing chamber, and the like. The processing chamber is a vacuum processing chamber for processing a wafer.

The control unit 102 includes an apparatus including a controller or a processor for controlling operation of the mechanical unit 101, for example, an IC substrate or a computer. The control unit 102 includes a calculation unit 103 and a storage unit 104. The control unit 102 is connected to a computer or the like serving as a host 115 via a network 114 such as a communication interface apparatus and a LAN. The computer or the like serving as the host 115 can execute a processing instruction and monitors a state of the control unit 102 as necessary. A user can perform input operation on a computer or the like serving as the host 115 and confirm a state of the vacuum processing apparatus on a display screen or the like.

The calculation unit 103 controls operation of each station associated with the transport and processing of a plurality of wafers while monitoring an overall state of the mechanical unit 101, determines a transport schedule of the wafers and instructs and controls wafer transport operation according to the transport schedule. The station refers to a place where the wafers move, stay, and transit, and specifically includes a vacuum transport container, an intermediate chamber, and a load lock chamber.

The calculation unit 103 includes a transport schedule processing unit 105 and a transport control processing unit 106 as processing units that are more detailed functional blocks. Each processing unit is implemented by software program processing, a circuit, or the like. The transport schedule processing unit 105 is a part that performs processing corresponding to a first step of determining the transport schedule, and the transport control processing unit 106 is a part that performs processing corresponding to a second step of controlling transport or the like based on the transport schedule.

The transport schedule processing unit 105 determines a transport schedule for each wafer of a plurality of wafers to be processed stored in a FOUP. The transport schedule includes an order of transport, a transport path, a transport timing, and the like for each wafer. The transport schedule processing unit 105 obtains each piece of information stored in the storage unit 104 via communication according to a transport algorithm described in software in advance. Each piece of information includes apparatus configuration information 107, apparatus state information 108, processing chamber information 109, transport path information 110, processing progress information 111, and operation time information 112. The transport schedule processing unit 105 calculates a transport schedule using the obtained information, and stores the calculated transport schedule in a wafer transport order information 113 of the storage unit 104. The transport schedule processing unit 105 transmits wafer transport order information corresponding to the calculated transport schedule to the transport control processing unit 106.

The transport control processing unit 106 controls transport processing of the plurality of wafers in the mechanical unit 101 according to the transport schedule determined by the transport schedule processing unit 105 (the corresponding wafer transport order information 113). The transport control processing unit 106 controls operation of the transport robot of the mechanical unit 101 and operation of a device such as a gate valve between stations. The transport control processing unit 106 calculates and transmits an instruction signal for performing wafer transport control to the mechanical unit 101 based on the wafer transport order information 113. The transport control processing unit 106 uses the instruction signal to control individual operations such as carrying in, carrying out, moving of the wafer by the transport robot, pressure reduction or pressure increase of the load lock chamber, processing of the processing unit, opening and closing of the gate valve, and the like.

The storage unit 104 includes a memory or the like, and stores various types of information and data of the control unit 102. The storage unit 104 stores the apparatus configuration information 107, the apparatus state information 108, the processing chamber information 109, the transport path information 110, the processing progress information 111, the operation time information 112, and the wafer transport order information 113 as information necessary for calculation processing by the calculation unit 103.

The apparatus configuration information 107 includes configuration information of various types of equipment provided in the mechanical unit 101, and includes information of identification information (ID), the number, and a type of a plurality of processing units including a plurality of processing chambers. The apparatus configuration information 107 includes information on a first processing type of the first processing unit and a second processing type of the second processing unit. The apparatus configuration information 107 includes information on the number M of the plurality of first processing units and the number N of the plurality of second processing units.

The apparatus state information 108 includes information indicating an operation state of each part of the mechanical unit 101 and information such as a pressure value.

The processing chamber information 109 includes information indicating a current internal state and a processing state of each processing chamber of the plurality of processing chambers of the mechanical unit 101 among the apparatus configuration and apparatus state. The processing chamber information 109 includes information on processing time (T1 and T2) for performing each processing of each processing chamber and information indicating remaining time of processing of each processing chamber. The processing time is the same processing time T1 of the plurality of first processing chambers for the first step and the same processing time T2 of the plurality of second processing chambers for the second step. These pieces of information change as the processing progresses, are periodically updated at predetermined time intervals, and include past information as well as latest information. These pieces of information are distinguished and stored in the apparatus state information 108 or the processing chamber information 109. The processing chamber information 109 may be merged into the apparatus configuration information 107 and the apparatus state information 108.

The transport path information 110 includes sequence information such as the transport path for each wafer and the order of transport of a plurality of wafers, related to each station through which the wafer moves or passes by the transport. A certain transport path includes a plurality of stations having an order, and includes ID of the first processing chamber used in the first step and ID of the second processing chamber used in the second step. The transport schedule information is constituted using a transport path of the transport path information 110. The transport path information 110 and the wafer transport order information 113 may be merged into one.

In the processing progress information 111, for a lot that is a specific group of wafers in which the processing proceeds in the mechanical unit 101, information indicating a progress state of the processing in the lot is stored. As an example, a plurality of wafers, for example, 15 wafers and 25 wafers are stored in one FOUP. Each wafer has ID such as a number. When information is acquired at predetermined time intervals, the processing progress information 111 includes information indicating how many wafers among the predetermined wafer processing order are carried out of the FOUP and processed at an arbitrary time among the predetermined time intervals. The processing progress information 111 includes information indicating which sequence in corresponding wafer processing instruction information (in other words, a sequence recipe) is being executed.

The operation time information 112 stores operation time information of each part of the mechanical unit 101. The operation time information 112 includes information related to operation time of the transport robot provided in the mechanical unit 101 and operation time of the gate valve.

The wafer transport order information 113 stores information indicating the transport order of a plurality of wafers stored in the FOUP, transport path information of each wafer and the like among the transport schedule information. The information includes, for example, a number indicating the transport order of the wafers, a number indicating a slot in the FOUP in which each wafer is stored, a number of the processing chamber in which each wafer is processed.

(3) Mechanical Unit

Next, the configuration of the mechanical unit 101 will be described with reference to FIG. 2. FIG. 2 shows a top view (an X-Y plane) of the mechanical unit 101. (X, Y, Z) is shown as a direction for description. An X direction and a Y direction form a horizontal plane and are two orthogonal directions, and a Z direction is a vertical direction. A first direction indicated by the Y direction is a front-rear direction in which a plurality of vacuum transport containers are arranged side by side. A second direction shown in the X direction is a left-right direction shown in the drawing. The mechanical unit 101 is roughly divided into an atmosphere side apparatus configuration unit 201 and a vacuum side apparatus configuration unit 202.

The atmosphere side apparatus configuration unit 201 is a part for carrying out and carrying in a wafer from the FOUP. The FOUP is capable of storing a plurality of wafers under atmospheric pressure. The atmosphere side apparatus configuration unit 201 includes load ports 41, 42, 43 which are a plurality of (for example, three) load ports provided in a housing 200, an atmosphere side transport robot 47, an aligner 48, and a shunting station 49. For example, with respect to the housing 200, the plurality of load ports are connected to a side surface on the front side in the Y direction, the aligner 48 is connected to one side surface in the X direction, and the shunting station 49 is connected to a side surface of one side in the X direction on a rear side in the Y direction. The FOUP is placed in the plurality of load ports. The atmosphere side transport robot 47 is a robot that performs wafer transport under atmospheric pressure, and can expand and contract, move up and down, turn a robot arm. The aligner 48 adjusts an orientation of the wafer and detects a center position. The shunting station 49 is a location for temporary shunting of the wafer.

The atmosphere side apparatus configuration unit 201 carries out the wafer to be processed from the FOUP by the atmosphere side transport robot 47, via the aligner 48, carries the wafer into the load lock chamber 10 connected to the vacuum side apparatus configuration unit 202 and carries the wafer into the shunting station 49. Further, the atmosphere side apparatus configuration unit 201 carries out the wafer that is transported from the vacuum side apparatus configuration unit 202 to the load lock chamber 10, and stores the wafer into the FOUP or the shunting station 49. The load lock chamber 10 is provided in the vacuum side apparatus configuration unit 202.

However, the atmosphere side apparatus configuration unit 201 is an example and is not limited to the above configuration. The vacuum processing apparatus may have more than or less than three load ports. The vacuum processing apparatus is not limited to one atmosphere side transport robot 47, and may include a plurality of atmosphere side transport robots. The vacuum processing apparatus is not limited to one aligner 48, but may include a plurality of aligners or may not include the aligner 48. Further, the vacuum processing apparatus is not limited to one shunting station 49, and may include two or more shunting stations, or may not include the shunting station 49.

The vacuum side apparatus configuration unit 202 is a part that performs wafer transport or the like under a pressure reduced from atmospheric pressure to a predetermined vacuum level, and processes the wafer inside the plurality of processing chambers. The vacuum side apparatus configuration unit 202 includes a plurality of processing chambers 11 to 17 which are vacuum processing chambers, a plurality of transport containers 20, 21, 22 which are vacuum transport containers, and a plurality of intermediate chambers 18 and 19 which are intermediate chambers.

The load lock chamber 10 is provided between the atmosphere side apparatus configuration unit 201 and the vacuum side apparatus configuration unit 202, in particular, between the housing 200 and a frontmost transport container 20 in the Y direction via gate valves 51 and 52. The load lock chamber 10 can reduce the pressure to a predetermined vacuum pressure or increase the pressure to the atmospheric pressure in a state where the wafer is contained, which is a part that mediates circulation between the atmosphere side and the vacuum side to a mutual region.

A plurality of transport containers 20, 21, 22 which are vacuum transport containers are arranged and connected in the Y direction. The plurality of vacuum transport containers include vacuum side transport robots 23, 24, 25 as a plurality of vacuum side transport robots. The vacuum side transport robot is provided in each transport container. For example, the transport container 20 includes the vacuum transport robot 23. In this example, there are three vacuum transport containers as a whole. Each of the vacuum side transport robots 23, 24, 25 is a robot that transports a wafer. The vacuum side transport robots 23, 24, 25 each include a hand or a robot arm capable of holding the wafer. The robot arm is capable of expanding and contracting, turning, moving up and down, and the like. The vacuum side transport robot transports the wafer to an adjacent load lock chamber 10, the processing chamber, or the intermediate chamber.

The processing chambers 11, 12, 13, 14, 15, 16, and 17, which are a plurality of vacuum processing chambers, are processing chambers that perform predetermined processing on the wafers. In this example, there are seven processing chambers as a whole including a first step and a second step. Each processing chamber is associated with a processing unit. In other words, the vacuum side apparatus configuration unit 202 includes a plurality of (seven) processing units corresponding to the processing chambers 11 to 17. Specifically, as the arrangement of the plurality of processing chambers, the processing chambers 11 and 12 on the left and right are connected to the transport container 20 in the second direction (X direction). The processing chambers 13 and 16 on the left and right are connected to the transport container 21 in the second direction. The processing chambers 14 and 15 on the left and right are connected to the transport container 22 in the second direction, and the processing chamber 17 on the rear side is connected to the transport container 22 in the first direction.

The plurality of intermediate chambers 18 and 19 each have a mechanism for holding a wafer and are connected between two adjacent vacuum transport containers. In this example, there are two intermediate chambers. Specifically, the intermediate chamber 18 is connected between the transport container 20 and the transport container 21. The intermediate chamber 19 is connected between the transport container 21 and the transport container 22.

Gate valves 51, 52, 53, 54, 55, 56, 57, 58, 59, 60, 61, 62, 63 are arranged, as a plurality of gate valves, between a plurality of pieces of equipment in the mechanical unit 101. The corresponding two parts are connected to each other by a respective gate valve. For example, the gate valve 53 is provided between the transport container 20 and the processing chamber 11. The gate valve 59 is provided between the transport container 20 and the intermediate chamber 18. By controlling opening and closing of each gate valve, the space of each piece of equipment can be partitioned or connected.

However, the vacuum side apparatus configuration unit 202 is an example, and is not limited to the above configuration. The vacuum processing apparatus is not limited to seven processing chambers, but may be more than or less than seven. Further, in the present embodiment, two or three processing chambers are connected to a side wall of one vacuum transport container. The vacuum processing apparatus is not limited to the number of such processing chambers connected, and one processing chamber may be connected to one vacuum transport container, or three or more processing chambers may be connected. The vacuum processing apparatus is not limited to three vacuum transport containers, but may be more than or less than three vacuum transport containers. The plurality of vacuum transport containers are arranged only in the first direction, but are not limited thereto, and may be arranged in other directions. Further, in the present embodiment, although the gate valve is provided between the vacuum transport container and the intermediate chamber, the gate valve may not be opened or closed, or may not be provided.

(4) Processing Chamber

Next, a configuration example of the arrangement of a plurality of processing chambers in the vacuum side configuration unit 202 of the vacuum processing apparatus 1 will be described with reference to FIG. 3. FIG. 3 shows an arrangement configuration of the plurality of processing chambers 11 to 17 corresponding to FIG. 2 in the present embodiment. The configuration includes the processing chambers 11 to 15, which are a plurality of (number M=5) first processing chambers for use in the first step which is the previous step, and the processing chambers 16 and 17, which are a plurality of (N=2) second processing chambers for use in the second step which is the subsequent step. The first processing chamber is associated with a first processing unit including the first processing chamber, and the second processing chamber is associated with a second processing unit including the second processing chamber. The first processing unit performs first processing as a first type. The second processing unit performs second processing as a second type.

In the embodiment, in multi-step processing, the first processing of the first step is ashing processing as the first type, and the second processing of the second step is cooling processing as the second type. The ashing processing is processing of removing an organic substance such as an unnecessary resist. The cooling processing is processing of cooling and lowering heat generated by the ashing processing. The first processing and the second processing are not limited to the above configurations. The first processing is not limited to the ashing processing, but may be other types of processing, and the second processing is not limited to the cooling processing, and may be other types of processing. In another embodiment, as another type, etching processing, film forming processing, and the like can be similarly applied.

In the embodiment, for convenience, the processing chambers 11 to 15 (corresponding first processing units) used in the previous step are also referred to as AUs {AU1, AU2, AU3, AU4, AU5}, and the processing chambers 16 and 17 (corresponding second processing units) used in the subsequent step are also referred to as CUs {CU1, CU2}. The AU is an abbreviation for "ashing unit" and is a first processing unit that performs ashing processing. The CU is an abbreviation for "cooling unit", and is a second processing unit that performs cooling processing.

In the embodiment, the number M of the first processing units and the first processing chambers in the mechanical unit 101 is 5, the number N of the second processing units and the second processing chambers in the mechanical unit 101 is 2, having an relationship of M>N. In addition, among the number M, the number of the first processing units and the first processing chambers used in the previous step in the transport schedule is a use number K, and K≤M. The number of the first processing chambers excluded in the transport schedule is defined as an exclusion number L (L=1, 2, . . . ). K=M−L.

However, the arrangement configuration is an example and is not limited to the above configuration. In the vacuum processing apparatus, the number M of the first processing chambers in the previous step is not limited to five, and may be three or more. In the vacuum processing apparatus, the number N of the second processing chambers in the subsequent step is not limited to two, and may be two or more.

In the embodiment, the processing units AU {AU1 to AU5} for the first step, as shown in the figure, are arranged at locations corresponding to the processing chambers 11 to 15, and the processing units CU {CU1, CU2} for the second step, as shown in the figure, are arranged at locations corresponding to the processing chambers 16 and 17. The location of the arrangement of each processing unit (AU, CU) is not limited to the above configuration.

(5) Transport Path

FIG. 4 shows a configuration example of transport path information in the embodiment and a comparative example to be described below. In a table 401 in FIG. 4, transport path information including five path candidates is stored, and corresponds to the transport path information 110 described above. The transport path information in FIG. 4 indicates possible transport path candidates when the transport schedule is constituted under the condition of the multi-step processing using all the processing chambers in the previous step and the subsequent step in the configuration of the mechanical unit 101 in FIG. 3. The entire transport path is a path that starts from the FOUP as a start position and returns to the FOUP via the load lock chamber, the first processing unit, and the second processing unit. In the table 401, for example, in a first path candidate identified by "1" in a first row, a start is FOUP, a previous step is the processing unit AU1, a subsequent step is the processing unit CU1 or CU2, and an end is FOUP. Although five path candidates are collectively described without separately dividing the processing units CU1 and CU2, the five path candidates correspond to a total of ten path candidates when dividing the processing units CU1 and CU2 separately.

(6) Comparative Example—Problems

Next, with reference to FIG. 5, a problem in the transport algorithm in the method in the related art related to the condition of the multi-step processing including the previous step and the subsequent step will be described.

FIG. 5 shows a time chart 501 of wafer processing when performing the multi-step processing on the transport path information of FIG. 4 in the arrangement configuration of a plurality of processing chambers of the mechanical unit similar to that in FIG. 3, as a configuration of the method of the comparative example to the embodiment. The time chart 501 corresponds to a transport schedule when a plurality of wafers are executed under a predetermined processing condition by each processing unit (AU, CU) in the previous step and the subsequent step. In the time chart 501, the illustrated horizontal direction indicates time, and the vertical direction indicates the plurality of processing units {AU1, AU2, AU3, CU1, AU4, AU5, CU2}. The processing condition in the time chart 501 indicates a case where the processing time T1 of the first processing units AU {AU1 to AU5} including the first processing chambers in the previous step is the same, the processing time T1 being 50 seconds, and processing time T2 of the second processing units CU {CU1, CU2} including the second processing chambers in the subsequent step is the same, the processing time T2 being 30 seconds. Processing time 502 indicated by a solid line frame indicates wafer processing time, and residence time 503 indicated by a broken line frame indicates wafer residence time. A number in the frame indicates a wafer number. For example, in the processing unit AU1, time for processing the wafer identified by "2" is the processing time 502, and then there is the residence time 503 before next processing time of the wafer identified by "7".

The transport path and the corresponding transport schedule in the comparative example are as follows. For example, for the wafer indicated by "1", a transport path from the processing unit AU4 in the first step to the processing unit CU2 in the second step is formed. Briefly, the transport path of each wafer is as follows. Wafer "1": AU4→CU2, wafer "2": AU1→CU1, wafer "3": AU3→CU2, wafer "4": AU5→CU1, wafer "5": AU2→CU2, wafer "6": AU4→CU1, wafer "7": AU1→CU1, wafer "8": AU3→CU2, wafer "9": AU5→CU2, wafer "10": AU2→CU1, wafer "11": AU4→CU2, wafer "12": AU1→CU1, wafer "13": AU3→CU2, wafer "14": AU5→CU1, wafer "15": AU2→CU2.

In the apparatus configuration and the processing condition in the comparative example, the subsequent step and the second processing unit CU corresponding thereto are rate-limited (in other words, a bottleneck). In this way, when the second step is rate-limited, when the use number K of the first processing chambers in the previous step is increased more than necessary, in other words, when a difference between the use number K in the previous step and the number N in the subsequent step is large, the wafer transport waiting time may occur. That is, as described above, by transporting the wafer from the FOUP earlier than timing required by the processing units CU1 and CU2 in the subsequent step, the number of wafers in the vacuum processing apparatus increases. Then, there is a case where waiting for completion of operation of the transport robot for transporting another wafer occurs, which may cause wafer transport waiting time.

Further, due to time during which the wafer resides in the intermediate chamber, a wafer that remains in the transport path of another wafer is generated. Due to the influence, since the wafer cannot be transported at timing required by any one of the processing units CU in the next second step, wafer transport waiting time occurs.

Due to the transport waiting time, as in the examples of the residence time 504, 505, 506, and 507, the residence time of the wafer occurs in each processing unit CU in the subsequent step that is a rate-limited region. For example, the residence time 504 is residence time that occurs before the processing of the wafer "4" and after the processing of the wafer "2" in the processing unit CU1. Accordingly, in the comparative example, there is a problem that processing efficiency of the entire vacuum processing apparatus is impaired.

(7) Transport Determination Method-Processing Flow

Next, with reference to FIG. 6, a transport determination method for optimizing the throughout, which is a transport determination method in the multi-step processing condition, in the operating method of the vacuum processing apparatus according to the embodiment will be described. A processing flow 600 of FIG. 6 is a processing flow in which the transport determination method is implemented, and is a processing flow related to the transport schedule processing unit 105 of the calculation unit 103 in FIG. 1 and the first step. The processing flow 600 shows a method of selecting an optimal use number K of the first processing chambers in the previous step based on a relationship between processing time (T1, T2) in the multi-step processing and controlling transport between steps. The processing flow 600 includes steps 601 to 607, which will be described below in the order of steps. As an overview, processing from steps 601 to 605 is processing of determining the K first processing units to be used in the previous step, and is processing of excluding a part of the first processing units. Step 606 is processing of determining a transport path for the use number K of first processing units used in the previous step. Step 607 is processing of determining the second processing unit in the subsequent step as a transport destination from the first processing units in the previous step. In step 607, the second processing unit having the highest throughput is selected from the plurality of second processing units, and the transport path from the first processing units in the previous step to the second processing unit in the subsequent step is determined. Thus, the processing flow 600 implements the optimization of the transport operation under the condition of the multi-step processing.

Although not shown, a predetermined condition is confirmed before the processing flow 600 or before the step 601. When the control unit 102 confirms the condition and satisfies the condition, the control unit 102 performs processing after step 601, that is, processing of determining a transport schedule by excluding a part of the first processing units. When the condition is not satisfied, the control unit 102 performs, for example, processing in the related art, that is, processing of determining a transport schedule using all the first processing units, without performing the processing after step 601. The condition is related to whether the second step is rate-limited, and is as follows. The condition is that each of the processing time T1 of the first step and the processing time T2 of the second step is longer than each of the transport time (H1) from wafer load lock chamber 10 to the first processing unit and the transport time (H2) from the first processing unit to the second processing unit (T1>H1, T1>H2, T2>H1, T2>H2).

In step 601, the calculation unit 103 calculates a number ratio of the number M of the first processing units and the number N of the second processing units (Q=M/N) from the apparatus configuration information 107. The calculation unit 103 calculates a time ratio R, which is a ratio of the processing time T1 in the previous step based on the processing time T2 in the subsequent step as the relationship of the processing time of the processing chambers in the respective steps of the plurality of steps from the processing chamber information 108. Each processing time (T1, T2) corresponds to occupation time in one processing chamber (a corresponding processing unit) per wafer. The occupation time of the first processing of the wafer in the first processing unit in the previous step is defined as the processing time T1, and the occupation time of the second processing of the wafer in the second processing unit in the subsequent step is defined as the processing time T2. As a formula, [time ratio (R)]=[processing time (T1) in previous step]/[processing time (T2) in subsequent step], that is, R=T1/T2.

In step 602, the calculation unit 103 confirms whether the number ratio (Q=M/N) is larger than the time ratio (R=T1/T2) as confirmation of the condition. The calculation unit 103 performs the following processing when the number ratio is larger than the time ratio (Q>R) under the condition. The calculation unit 103 multiplies the time ratio R calculated in step 601 by the number N of the second processing chambers in the subsequent step stored in the apparatus configuration information 107 to calculate the use number K of the first processing chambers necessary for the previous step. As a formula, [use number (K) of processing chambers in the previous step]=[time ratio (R)]×[number (N) of processing chambers in the subsequent step], that is, K=R×N (=T1/T2×N).

In steps 603, 604, 605, since the actual use number K needs to be a natural number, the calculation unit 103 performs processing of determining the use number K of the natural number based on the confirmation. Step 603 is confirmation of whether the calculated value in step 602 is a natural number. When the determination is affirmative (Y), the processing moves to step 604, and when the determination is negative (N), the processing moves to step 605. Step 604 is processing in which the calculated value is regarded as the use number K of the processing chambers required in the previous step. Step 605 is processing in which the smallest natural number that is equal to or greater than the calculated value is regarded as the use number K of the processing chambers required in the previous step.

In step 606, the calculation unit 103 confirms whether the number M of the processing chambers in the previous step stored in the apparatus configuration information 107 includes the use number K of the processing chambers required in the previous step based on the relationship of the processing time (T1, T2) (in other words, M≥K). Then, the calculation unit 103 determines the transport path for the K processing chambers (corresponding first processing units) to be used in the previous step from the number M and the use number K of the processing chambers in the previous step.

When the use number K of the processing chambers required in the previous step is smaller than the number M of the processing chambers in the previous step (K<M), the calculation unit 103 selects the first processing chambers that are not used and are excluded from the candidates from the M of first processing chambers in the previous step. That is, the calculation unit 103 selects and excludes one or more first processing chambers corresponding to an exclusion number L (=M−K). The calculation unit 103 configures a plurality of transport path candidates using the M first processing chambers to be used after exclusion.

The calculation unit 103 selects, for at least one wafer of the plurality of wafers, the first processing unit to be excluded from the M first processing units in a predetermined order in consideration of a length of the transport path or the transport time. In the embodiment, the length of the transport path is represented by the number of stations passing from a start point to an end point. The length of the transport path may be measured and represented by another method.

When the first processing chamber to be excluded from the M first processing chambers in the previous step is selected, the following processing examples are exemplified in detail. A processing chamber having a large number of stations passing through the previous step and the subsequent step is a processing chamber having long wafer transport time between steps or a processing chamber having a long transport path. The number of stations passing through can be calculated from the apparatus configuration information 107 or the like. The transport time between steps can be calculated from the operation time information 112 and the like.

Such a processing chamber is highly likely to generate operation waiting time and impair processing efficiency due to complexities such as blocking the transport paths of other wafers when the wafer is transported from one first processing chamber to the next second processing chamber. Therefore, The calculation unit 103 excludes from the candidates the number L to be excluded in an order from the first processing chamber having the longest transport time between the steps. The calculation unit 103 configures a transport path using a plurality of first processing chamber candidates as a result of the exclusion, and stores the transport path as the new transport path information 109.

Specifically, for example, the calculation unit 103 sequentially excludes a first processing chamber in the order from a first processing chamber having the largest number of stations passing through the transport path from each first processing chamber in the previous step to each second processing chamber in the subsequent step. When there are two or more first processing chambers that have the same transport path or transport time, that is, two or more first processing chambers that have the same number of stations passing through, the calculation unit 103 further selects a first processing chamber to be excluded from the two or more first processing chambers. Specifically, the calculation unit 103 takes into consideration the transport time from the FOUP to the first processing chamber in the previous step, and sequentially excludes the first processing chamber having the longest transport time.

In the example according to the embodiment, similarly to the comparative example, it is assumed that the processing time T1 in the previous step is 50 seconds and the processing time T2 in the subsequent step is 30 seconds. In the case of the condition of the apparatus configuration of FIG. 3, a transport determination result by the processing flow 600 in FIG. 6 is, for example, as follows. As the relationship between the processing time (T1, T2), the processing time T1 in the previous step is about 1.666 times the processing time T2 in the subsequent step (R=T1/T2=50/30≈1.66). In the above apparatus configuration, since two processing chambers {processing units CU1, CU2} are provided in the subsequent step, a calculated value of the use number K of the processing chambers necessary for the previous step is about 3.33 (K=R×N≈1.66×2=3.33). In order to obtain a natural number, the use number K of the processing chamber in the previous step is 4.

Since the number M of the processing chambers in the previous step is 5 and the use number K is 4, L=1 first processing chamber is excluded based on L=M−K. When selecting the first processing unit to be excluded, the calculation unit 103 takes into consideration the number of stations passing through during the transport from each of the first processing units AU {AU1 to AU5} to each of the second processing units {CU1, CU2}. As a result, the first processing unit having the largest number of stations passing through is, for example, the processing units AU1 and AU2. Therefore, these two processing units AU1 and AU2 are candidates for exclusion.

Further, in order to select one first processing unit from the two first processing units, the calculation unit 103 takes into consideration the transport time, the operation time, and the like related to the first processing unit in the previous step. Specifically, the calculation unit 103 also takes into consideration the operation time such as turning operation of a vacuum side transport robot. As a result, the first processing unit in the previous step having the longest operation time is, for example, the processing unit AU2. The calculation unit 103 selects and excludes the processing unit AU2, and configures a combination of the transport paths by using the remaining M first processing units to be used.

In step 607, the calculation unit 103 selects a second processing chamber (a corresponding second processing unit) of an optimal transport destination in the transport from the first processing chamber in the previous step to the second processing chamber in the subsequent step as the transport pattern used for the multi-step processing based on the transport path in step 606. The calculation unit 103 selects the second processing chamber in which the processing in the subsequent step is completed as the transport destination from the previous step to the subsequent step, or the second processing chamber in which the processing is completed earliest based on the remaining processing time stored in the processing chamber information 108 as the transport destination of the subsequent step.

Here, the calculation unit 103 selects the transport destination as follows when the plurality of second processing chambers in the subsequent step have already completed the processing, or when there are a plurality of second processing chambers that are candidates for the transport destination that is scheduled to complete the processing at the same time. That is, the calculation unit 103 selects, from the operation time information 111, the second processing chamber having the shortest transport time, specifically, the second processing chamber having the smallest number of stations passing between the steps as the transport destination.

In this way, in the operation method of the vacuum processing apparatus according to the embodiment, the control unit 102 determines the transport schedule using the transport path from the processing chamber in the previous step selected in step 606 to the processing chamber in the subsequent step selected in step 607. The processing of the processing flow 600 is similarly repeated for each wafer to be processed (for example, each lot). That is, an optimal transport schedule can be determined for each wafer to be processed (for example, for each lot). In the case of a wafer to which the same processing condition is applied, transport control based on the same transport schedule is applied. Thereafter, the transport control processing unit 106 of the control unit 102 controls the execution of the wafer processing based on the determined transport schedule.

The operating method according to the embodiment determines and switches the selected transport pattern and the corresponding transport schedule by optimizing the relationship between the processing time and the number of processing chambers for each wafer to be processed as described above. Accordingly, the operating method minimizes a difference in the number of wafers processed in each processing chamber in the subsequent step for a certain period, and selects an optimal transport pattern while preventing a processing load on the control system even when the second step is rate-limited. Accordingly, the throughput of the processing of the plurality of wafers is optimized.

The processing flow 600 excludes, for example, one first processing unit (for example, the processing unit AU2) as a result of the calculation. However, the processing flow 600 is not limited thereto, and may exclude two or more first processing units depending on conditions as a result of the calculation. That is, different first processing units may be excluded depending on the wafers. In this case, at least two wafers among the plurality of wafers are excluded from the different first processing units and have a transport schedule including different transport patterns. In other words, for a first wafer among the plurality of wafers, a first schedule including a transport path selected from a certain first processing unit (for example, the processing unit AU2) is excluded. For a second wafer, a second schedule including a transport path selected from other first processing units (for example, the processing unit AU3) is excluded.

(8) Transport Operation

Next, differences in transport operation before and after application of the operating method of the vacuum processing apparatus according to the embodiment (the corresponding transport determination method in FIG. 6) and effects thereof will be described with reference to FIGS. 7 and 8. FIGS. 7 and 8 show a comparison of the transport operation before and after the application in the case of the processing condition in which the processing time T1 of the first processing chamber in the previous step is 50 seconds and the processing time T2 of the second processing chamber in the subsequent step is 30 seconds in the case of the apparatus configuration in FIG. 3 and the transport path information in FIG. 4.

FIG. 7 shows a transport path before and after the application. A transport path 701 indicates a plurality of transport paths before application, and a transport path 702 indicates a plurality of transport paths after application. Arrows indicate wafer transport paths between the steps. The plurality of transport paths before application correspond to the five path candidates in FIG. 4 (ten path candidates when the processing units CU1 and CU2 are divided). With respect to the transport path 701 before application, in the transport path 702 after application, transport paths k1 and k2 related to the excluded processing unit AU2 is excluded as a result of determining an optimal use number K of the processing chambers in the previous step from the relationship between the processing time (T1, T2). Specifically, before application, each of the first processing units AU {AU1 to AU5} in the first step has two transport paths to the two second processing units CU1 and CU2. For example, the transport path k1 is a transport path from the processing unit AU2 to the processing unit CU1, and the transport path k2 is a transport path from the processing unit AU2 to the processing unit CU2. After application, the processing unit AU2 is excluded, so that the two transport paths k1 and k2 are excluded.

FIG. 8 shows a comparison of time charts of wafer processing before and after application corresponding to FIG. 7. A time chart 703 shows a time chart of the wafer processing for each processing unit before application, and shows the same transport operation as the time chart 501 in FIG. 5. A time chart 704 shows a time chart of the wafer processing for each processing unit after application. A horizontal axis represents time, and a vertical axis represents a plurality of processing units {AU1, AU2, AU3, CU1, AU4, AU5, CU2}. The meanings of the processing time 502 and the residence time 503 are the same as described above.

After application, the transport path and the corresponding schedule are as follows. Briefly, the transport path of each wafer is as follows. Wafer "1": AU4→CU2, wafer "2": AU1→CU1, wafer "3": AU5→CU2, wafer "4": AU3→CU1, wafer "5": AU4→CU2, wafer "6": AU1→CU1, wafer "7": AU5→CU2, wafer "8": AU3→CU1, wafer "9": AU4→CU2, wafer "10": AU1 CU1, wafer "11": AU5→CU2, wafer "12": AU3→CU1, wafer "13": AU4→CU2, wafer "14": AU1→CU1, and wafer "15": AU5→CU2.

The time chart 703 before application and the time chart 704 after application are compared with each other as follows. Before application, a wafer residence location is generated in the second step that is rate-limited, such as the wafer transport waiting time 504, 506, 507, and 508. On the other hand, after application, the wafer transport waiting time before application is eliminated, as indicated by time points (wafer residence elimination locations) 704, 705, 706, and 707 between the processing time adjacent in the time direction. After application, the use number M of the processing chambers in the previous step is optimized to a required number (K=4). Accordingly, the number of wafers in the vacuum processing apparatus is optimized, and the influence of waiting for the operation of the transport robot during the wafer transport operation between the steps is eliminated or reduced. Accordingly, the transport waiting time is eliminated after application. For example, at the time point 704, there is no residence after the processing time of wafer "2", and the processing time of wafer "4" immediately follows.

Processing efficiency improvement time (ΔT) 713 indicates a difference between an end time point of the entire processing before application and an end time point of the entire processing after application. Before and after application, for example, for the processing of 15 wafers "1" to "15", the apparatus utilization efficiency corresponding to the processing efficiency improvement time (ΔT) 713, in other words, the throughput is improved.

(9) Effects

As described above, according to the operating method of the vacuum processing apparatus according to the embodiment, in the case of the link-type vacuum processing apparatus, efficient transport and processing related to the multi-step processing can be implemented. According to the embodiment, in the processing condition in which the processing time of the plurality of processing chambers of the plurality of processing units that are candidates for use for each step are the same, even when the second step which is a subsequent step among the plurality of steps is rate-limited, a transport schedule including an optimal transport pattern can be selected while preventing the overall processing load. According to the embodiment, as in the processing efficiency improvement time (ΔT) 713 in FIG. 8, it is possible to provide a control system capable of improving the apparatus utilization efficiency and the like even when the second step is rate-limited. According to the embodiment, the transport pattern in which the relationship between the processing time and the number of the processing chambers is optimized is determined and switched for each wafer to be processed. As a result, the difference in the number of wafers processed in each processing chamber in the second step for a certain period is minimized. Therefore, even when the second step is rate-limited, it is possible to select an optimal transport pattern without significantly applying a processing load to the control system.

For the optimization, in order for the processing in the processing chamber in the previous step to be completed in accordance with timing at which the processing chamber in the subsequent step needs the wafer, it is necessary to transport the wafer from the FOUP to the first processing chamber in the previous step, and to correctly select the next empty second processing chamber in the subsequent step as a transport destination of the wafer from the first processing chamber. For this reason, in the operating method in the embodiment, the transport path information is updated after calculating the use number K of processing chambers in the previous step based on the processing time (T1, T2) in each step, and, in the transport between steps, the processing chamber in the subsequent step with good transport efficiency is selected based on the processing state in the subsequent step. Accordingly, the operating method implements the control of switching the optimal transport pattern.

Although the invention has been described in detail based on the embodiment, the invention is not limited to the embodiment described above, and various modifications can be made without departing from the scope of the invention.

REFERENCE SIGN LIST 101 mechanical unit
102 control unit
103 calculation unit
104 storage unit
105 transport schedule processing unit
106 transport control processing unit
107 apparatus configuration information
108 apparatus state information
109 processing chamber information
110 transport path information
111 processing progress information
112 operation time information
113 wafer transport order information
114 network
115 host
201 atmosphere side apparatus configuration unit
202 vacuum side apparatus configuration unit
10 load lock chamber
11, 12, 13, 14, 15, 16, 17 processing chamber
18, 19 intermediate chamber
20, 21, 22 transport container
23, 24, 25 vacuum side transport robot
26, 27, 28, 29, 30, 31, 32, 33, 34, 35, 36, 37, 38 gate valve
41, 42, 43 load port
47 atmosphere side transport robot
48 aligner
49 shunting station

The invention claimed is:
1. An operating method of a vacuum processing apparatus,
the vacuum processing apparatus comprising:
a plurality of vacuum transport containers arranged side by side, each of which stores a transport robot that transports a wafer;

a plurality of intermediate chambers disposed between two adjacent vacuum transport containers in the plurality of vacuum transport containers and storing the wafer;

a load lock chamber connected to one of the plurality of vacuum transport containers, storing the wafer, and capable of reducing pressure to a predetermined pressure and increasing pressure to atmospheric pressure; and a plurality of processing units connected to the plurality of vacuum transport containers including, among multi-step processing, a plurality of first processing units for performing first processing of a first step and a plurality of second processing units for performing second processing of a second step, with each processing unit including a processing chamber that is configured to process the wafer, the operating method comprising:

a first step of selecting one first processing unit and one second processing unit among the plurality of processing units for each wafer, and determining a transport schedule including a transport path using the selected processing units, which is a step of determining a transport schedule such that time required for all processing of the plurality of wafers in the multi-step processing is the shortest; and a second step of transporting each wafer of the plurality of wafers stored in a cassette that is arranged in front of the load lock chamber according to the transport schedule, implementing the first processing using the one first processing unit of the first step, and then controlling to implement the second processing using the one second processing unit of the second step, wherein the first step configures the transport schedule including the transport path using the first processing unit selected from the plurality of first processing units by excluding at least one first processing unit for at least one of the plurality of wafers.

2. The operating method of the vacuum processing apparatus according to claim 1, wherein the first step calculates a number ratio of a number of the plurality of first processing units and a number of the plurality of second processing units included in the vacuum processing apparatus, calculates a time ratio between first processing time required for the first processing of each first processing unit of the plurality of first processing units and second processing time required for the second processing of each of the second processing units of the plurality of second processing units, and when the number ratio is larger than the time ratio, for at least one of the plurality of wafers, calculates a use number from a smallest natural number that is equal to or greater than a calculated value obtained by multiplying the time ratio by the number of the plurality of second processing units, and selects the use number of the first processing units and determines the transport schedule.

3. The operating method of the vacuum processing apparatus according to claim 1, wherein each processing time of the first processing time required for the first processing of each first processing unit of the plurality of first processing units, and the second processing time required for the second processing of each second processing unit of the plurality of second processing units is longer than a first transport time of each of the wafers from the load lock chamber to the first processing unit and a second transport time from the first processing unit to the second processing unit.

4. The operating method of the vacuum processing apparatus according to claim 1, wherein the first step selects, for at least one of the plurality of wafers, a processing unit to be excluded from the plurality of first processing units in a predetermined order in consideration of a length of the transport path or the transport time.

5. The operating method of the vacuum processing apparatus according to claim 4, wherein the first step excludes the first processing unit having a longest length of the transport path from the first processing unit to the second processing unit.

6. The operating method of the vacuum processing apparatus according to claim 5, wherein when there are a plurality of first processing units of exclusion candidates having the same transport path length from the first processing unit to the second processing unit, the first step excludes the first processing unit having a longest length of the transport path from the load lock chamber to the first processing unit among the plurality of first processing units of the exclusion candidates.

7. The operating method of the vacuum processing apparatus according to claim 1, wherein for at least two wafers of the plurality of wafers, the first step excludes different first processing units from the plurality of first processing units and determines the transport schedule including the selected different transport path.

* * * * *